(12) United States Patent
Han

(10) Patent No.: US 10,278,308 B2
(45) Date of Patent: Apr. 30, 2019

(54) INTERLACED HEAT DISSIPATION STRUCTURE OF ADDIN CARD

(71) Applicant: EVGA CORPORATION, New Taipei (TW)

(72) Inventor: Tai-Sheng Han, New Taipei (TW)

(73) Assignee: EVGA CORPORATION, New Taipei (TW)

(*) Notice: Subject to any disclaimer, the term of this patent is extended or adjusted under 35 U.S.C. 154(b) by 0 days.

(21) Appl. No.: 15/475,159

(22) Filed: Mar. 31, 2017

(65) Prior Publication Data
US 2018/0213680 A1 Jul. 26, 2018

(30) Foreign Application Priority Data
Jan. 20, 2017 (TW) .............................. 106201025 U

(51) Int. Cl.
H05K 7/20 (2006.01)
G06F 1/20 (2006.01)

(52) U.S. Cl.
CPC .......... *H05K 7/20409* (2013.01); *G06F 1/20* (2013.01); *H05K 7/20172* (2013.01); *H05K 7/20509* (2013.01)

(58) Field of Classification Search
CPC ......... H05K 7/200172; H05K 7/20409; H05K 7/20509

USPC ...................................................... 361/679.47
See application file for complete search history.

(56) References Cited

U.S. PATENT DOCUMENTS

| | | | |
|---|---|---|---|
| 7,369,412 B2* | 5/2008 | Peng | ...................... H01L 23/427 165/104.21 |
| 7,382,616 B2* | 6/2008 | Stefanoski | ................ G06F 1/20 165/104.33 |
| 7,443,672 B2* | 10/2008 | Peng | ................... H01L 23/4006 165/104.33 |
| 7,782,617 B2* | 8/2010 | Li | ............................. G06F 1/20 165/104.33 |

* cited by examiner

Primary Examiner — Mukundbhai G Patel
(74) Attorney, Agent, or Firm — Leong C. Lei

(57) ABSTRACT

An interlaced heat dissipation structure of an addin card generally includes an addin card, a plurality of heat dissipation fins arranged on the addin card, at least one receiving space defined between the heat dissipation fins, a plurality of cooling pipes extending through the heat dissipation fins, and a plurality of heat dissipative elements arranged in the receiving space in a manner of being interlaced with the cooling pipes. As such, the heat dissipation fins, the cooling pipes, and the heat dissipative elements help cool down the addin card to keep the operation of the addin card stable. The interlaced arrangement of the cooling pipes and the heat dissipative elements in the receiving space defined between the heat dissipation fins makes it possible to maximize the total effective heat dissipation area.

5 Claims, 4 Drawing Sheets

INTERLACED HEAT DISSIPATION STRUCTURE OF ADDIN CARD

TECHNICAL FIELD OF THE INVENTION

The present invention relates generally to an interlaced heat dissipation structure, and more particularly to an interlaced heat dissipation structure of an addin card that helps lower a temperature of the addin card and achieve an effect of maximum heat dissipation area.

DESCRIPTION OF THE PRIOR ART

All sorts of substance exhibit electrical resistivity of different degrees, where electrical charges flowing in the substance are subjected to resistance that is similar to mechanical frictional force. Such a resistance force results from collision between electrons and atoms and this converts electrical power into thermal energy. Operations of electrical appliances may consume additional electrical power due to the generation of heat; however, the conversion of electrical power into thermal energy is not simply devoid of any merit. Depending on uses, some electronic equipment is operated on the basis of such characteristics of electrical resistance. For example, an electrical heater may be used to provide thermal energy so that the electrical heater is useful in keeping warm or heating water. For electronic equipment of computers, they consume a great amount of electrical power and may generate a lot of heat, causing an undesired rise of temperature of for example an addin card arranged in the electronic equipment. When the temperature of the addin card gets high, the operation of the addin card becomes unstable and in the worst situation, the addin card gets down and stops functioning, or may even lead to damage to the electronic equipment, or cause a fire and hurting users. Thus, it is important to provide a heat dissipation device on the addin card to lower down the temperature of the addin card.

Using a heat dissipation device may help effectively lower down the temperature of an addin card and keeps the addin card in normal operation. However, the heat dissipation device may involve heat dissipation fins that need to expand a contact area thereof with air to increase the efficiency of exchange of heat with air. Thus, the number of heat dissipation devices involved needs to be increased to expand the contact area thereof with air in order to make the heat dissipation performance better. However, using a large number of heat dissipation devices may result, adversely, the size of the electronic equipment in which the heat dissipation devices are installed, leading undesired inconvenience of a user for carrying and using.

Thus, it is a challenge of those devoted in this field to provide a solution to overcome such problems.

SUMMARY OF THE INVENTION

In view of the above problems and drawbacks, the present invention aims to provide an interlaced heat dissipation structure of an addin card that helps lower a temperature of the addin card and achieve an effect of maximum heat dissipation area.

The primary objective of the present invention is to provide a design of heat dissipation fins, cooling pipes, and heat dissipative elements to help lower down a temperature of an addin card.

Another objective of the present invention is to provide an interlaced design of cooling pipes and heat dissipative elements to allow the heat dissipative elements and the cooling pipes to be accommodated in a receiving to achieve an effective use of the space.

A structure that is adopted in the present invention to achieve the above objective generally comprises an addin card, wherein the addin card is provided with a plurality of heat dissipation fins thereon and the heat dissipation fins define therebetween at least one receiving space. The heat dissipation fins receive a plurality of cooling pipes extending therethrough for cooling the addin card. The receiving space receives a plurality of heat dissipative elements therein in a manner of being interlaced with the cooling pipes for cooling the addin card. As such, the heat dissipation fins, the cooling pipes, and the heat dissipative elements may absorb thermal energy from the addin card and increase a contact area with air to thereby increase the efficiency of heat exchange with air to achieve the purpose of dissipating heat from the addin card. Further, the cooling pipes and the heat dissipative elements are arranged in an interlaced manner in the receiving space defined between the heat dissipation fins to provide good heat dissipation performance within a limited amount of space.

With the above techniques, the problems and drawbacks of the prior art heat dissipation devices that the size is excessively large and causes inconvenience for a user to carry and use can be overcome and thus an advantage of improving utilization can be achieved with the present invention.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
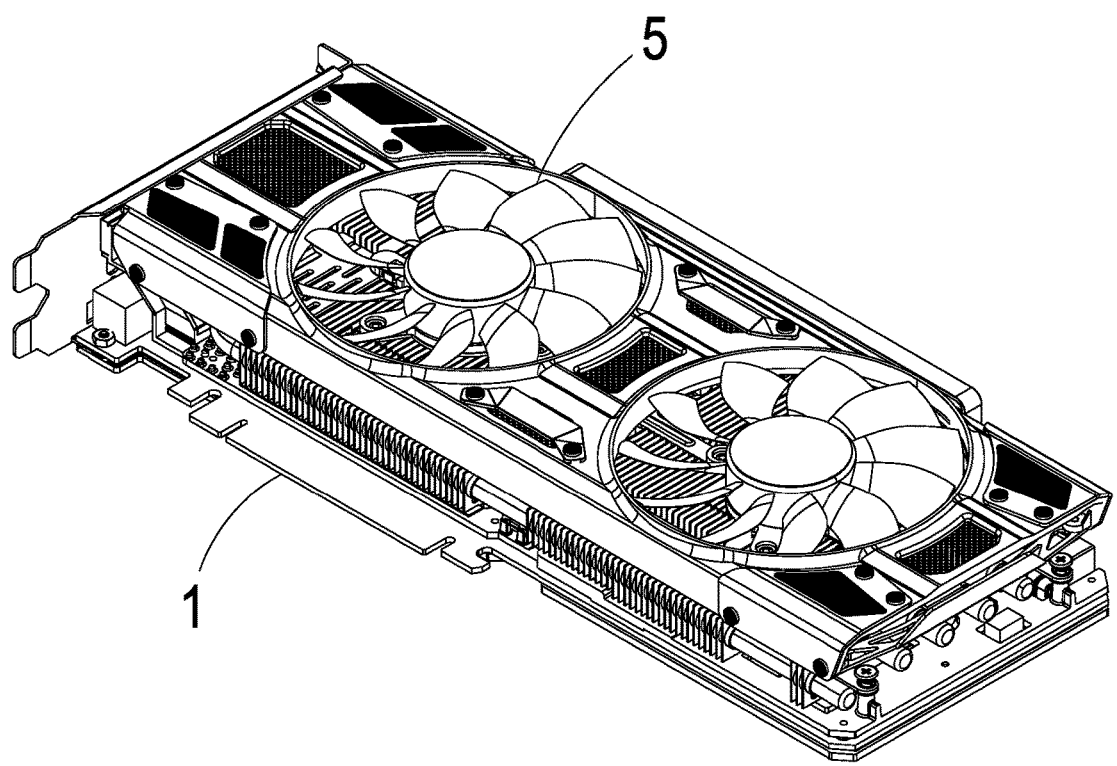
FIG. 1 is a perspective view showing a preferred embodiment of the present invention.
Figure 2:
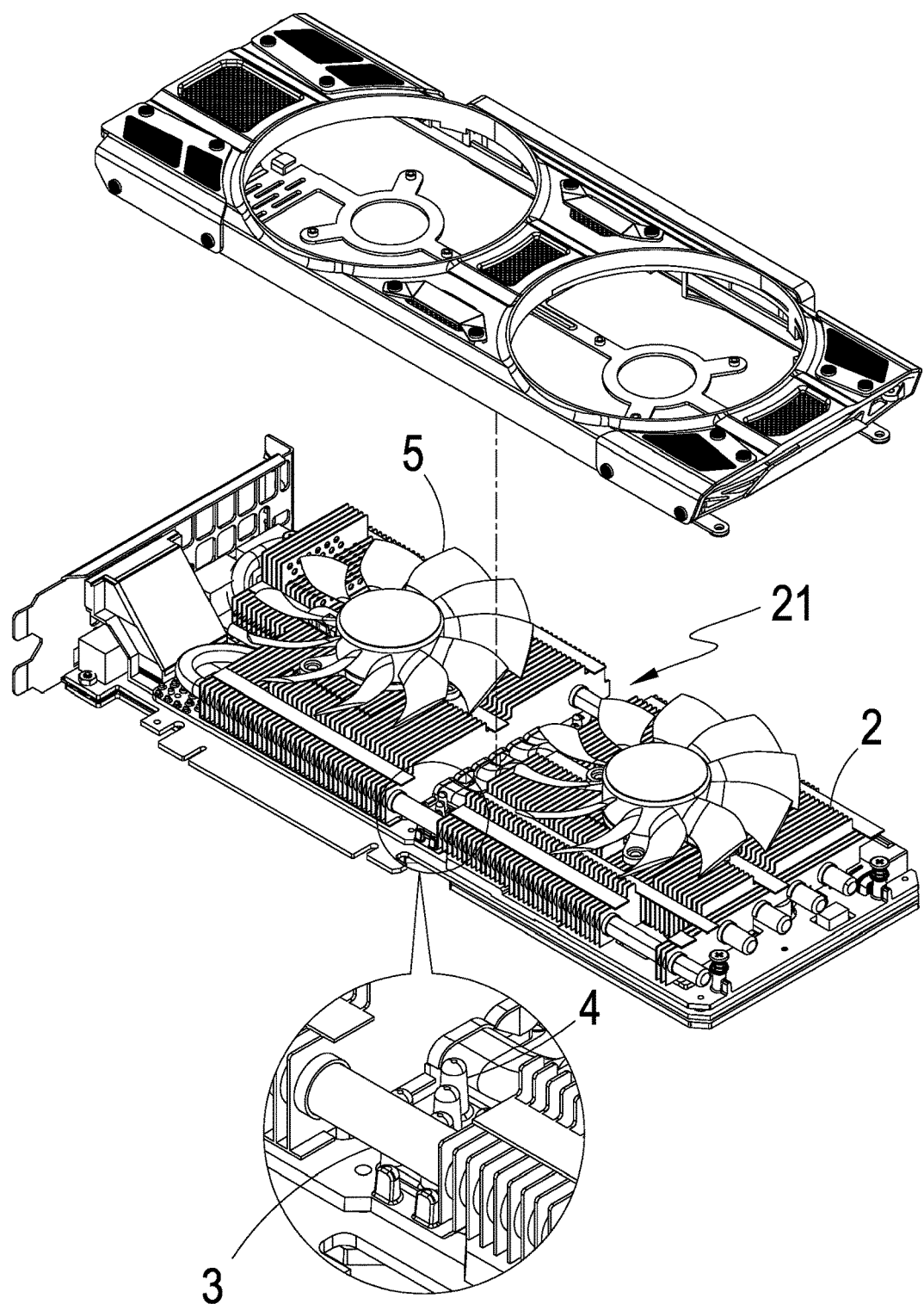
FIG. 2 is a schematic view illustrating inside details of the preferred embodiment of the present invention.
Figure 3:
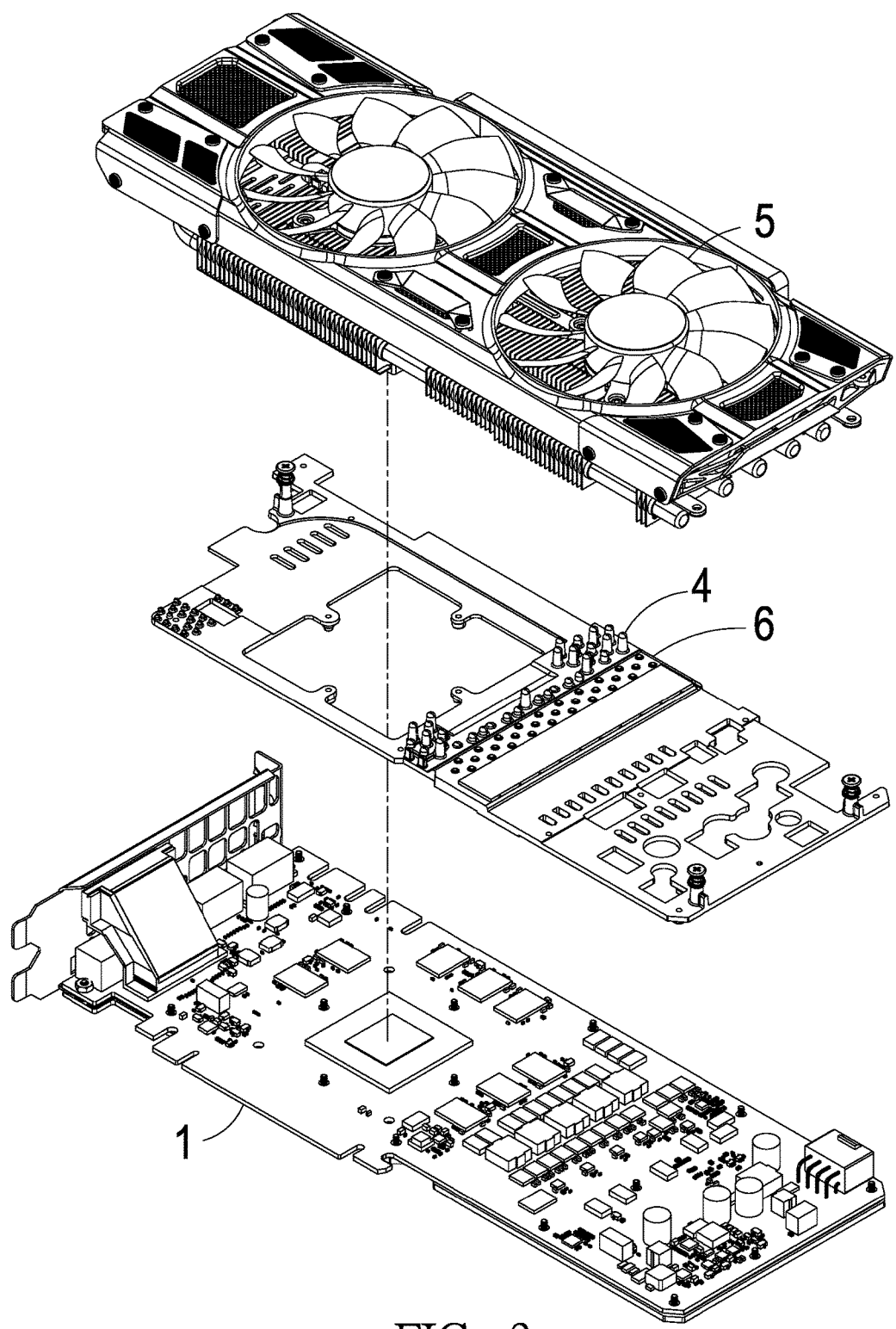
FIG. 3 is an exploded view of the preferred embodiment of the present invention.
Figure 4:
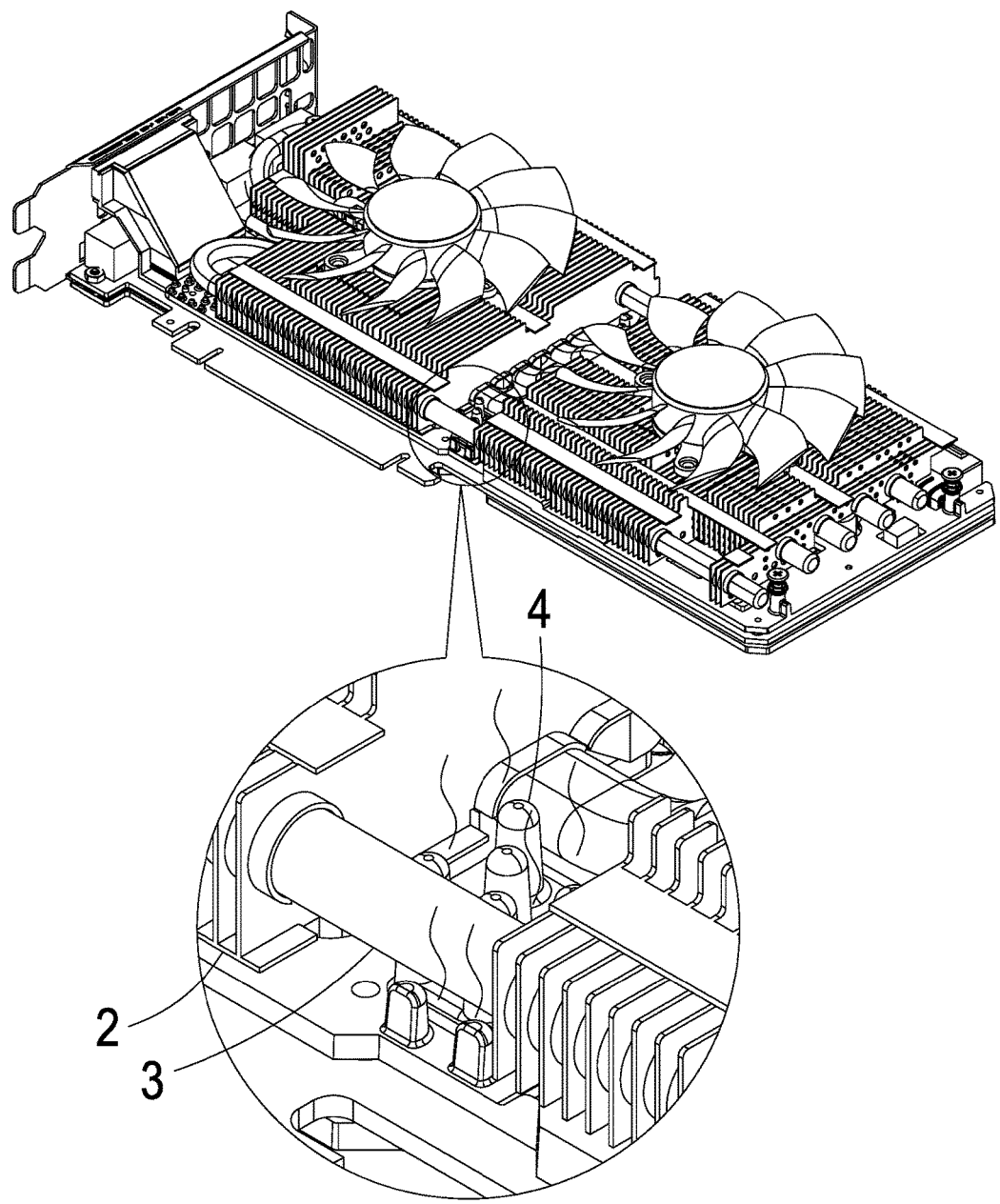
FIG. 4 is a schematic view showing an application of the preferred embodiment of the present invention.

Referring to FIGS. 1-3, which are a perspective view showing a preferred embodiment of the present invention, a schematic view illustrating inside details of the preferred embodiment of the present invention, and an exploded view of the preferred embodiment of the present invention, these drawings clearly show that the present invention comprises:

an addin card 1, which is for example a graphics card;

a plurality of heat dissipation fins 2, which are arranged on the addin card 1, the heat dissipation fins 2 defining at least one receiving space 21 therebetween, the heat dissipation fins 2 being provided with at least one fan 5 located thereon;

a plurality of cooling pipes 3, which extend through the heat dissipation fins 2 for cooling down the addin card 1;

a plurality of dissipative elements 4 that are arranged in the receiving space 21 in a manner of being interlaced with the cooling pipes 3 for cooling down the addin card 1; and at least one heat conductive board 6 that is arranged between the addin card 1 and the heat dissipation fins 2.

Referring collectively to FIGS. 1-4, which are a perspective view showing a preferred embodiment of the present invention, a schematic view illustrating inside details of the preferred embodiment of the present invention, an exploded view of the preferred embodiment of the present invention, and a schematic view showing an application of the preferred embodiment of the present invention, these drawings clearly show that the addin card 1, when put into operation, would cause a rise of temperature, and when the temperature of the addin card 1 gets high, the addin card 1 would no longer keep normal operation. Thus, it is necessary to arrange the heat dissipation fins 2 to lower down the temperature of the addin card 1; however, the heat dissipation fins 2 may cause a disadvantage of poor air ventilation. Thus, the cooling pipes 3 are set to extend through the heat dissipation fins 2 so that the cooling pipes 3 may enhance the effect of heat dissipation, and the heat dissipative elements 4 are arranged in the receiving space 21 that is defined between the heat dissipation fins 2 in a manner of being interlaced with the cooling pipes 3. The interlaced arrangement of the cooling pipes 3 and the heat dissipative elements 4 achieves an effective use of the amount of space of the receiving space 21 so as to achieve an effect of exhibiting maximum heat dissipation performance in a minimum space. Further, the heat dissipation fins 2, the cooling pipes 3, and the heat dissipative elements 4 are made of metallic materials that have high conductivities so that excessive thermal energy of the addin card 1 may be conducted through the heat conductive board 6 to the heat dissipation fins 2, the cooling pipes 3, and the heat dissipative elements 4 and the efficiency of heat exchange with air can be enhanced through an expansion of area with air by the arrangement of the heat dissipation fins 2, the cooling pipes 3, and the heat dissipative elements 4 thereby efficiently lowering down the temperature of the addin card 1. The fan 5 can be used in combination with the above the help circulation of air in order to expel heated air away from the addin card 1 and guide cool air to the heat dissipation fins 2, the cooling pipes 3, and the heat dissipative elements 4 to achieve an effect of circulation for dissipation of heat.

The example provided previously is concerned about just a preferred way of embodying the present invention and is not intended to impose limitations to the scope of the present invention. Minor modifications and variations that do not depart from the inventive idea of the present invention as defined in the attached claims, are considered within the scope of the present invention.

Thus, with reference to all the drawings, when put into use, the present invention provides, compared to the prior art, the following advantages:

(1) The arrangement of the heat dissipation fins 2, the cooling pipes 3, and the heat dissipative elements 4 helps lower down the temperature of the addin card 1.

(2) The interlaced arrangement of the cooling pipes 3 and the heat dissipative elements 4 allows the heat dissipative elements 4 and the cooling pipes 3 to be accommodated in the receiving space 21 to provide an effect of effective use of the space.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the claims of the present invention.

I claim:

1. An interlaced heat dissipation structure of an addin card, comprising:

an addin card;

a plurality of heat dissipation fins arranged on the addin card;

at least one receiving space defined between the heat dissipation fins;

a plurality of cooling pipes extending through the heat dissipation fins for cooling the addin card; and a plurality of heat dissipative elements arranged in the receiving space in a manner of being interlaced with the cooling pipes for cooling the addin card;

wherein the plurality of heat dissipation fins are divided into at least a first group and a second group that are spaced from each other to define the receiving space therebetween such that the first and second groups of heat dissipation fins are located on two sides of the receiving space to dissipate heat from portions of the addin card corresponding to the two sides of the receiving space; and wherein the cooling pipes each have a portion extending between the first and second groups of heat dissipation fins, and the portions of the cooling pipes and the heat dissipative elements are arranged in an interlaced manner in the receiving space defined between the heat dissipation fins such that the heat dissipative elements are located on two sides of the portion of each of the cooling pipes that is located in the receiving space and extends between the first and second groups of the heat dissipation fins and the portions of the cooling pipes that extend between the first and second groups of the heat dissipation fins are located on two sides of at least a portion of the heat dissipative elements in order to provide additional heat dissipation from a portion of the addin card corresponding to the receiving space, wherein heat is dissipated from different portions of the addin card through the heat dissipation fins and the heat dissipative elements in combination with the cooling pipes.

2. The interlaced heat dissipation structure of the addin card according to claim 1, wherein the heat dissipation fins are provided with at least one fan positioned thereon.

3. The interlaced heat dissipation structure of the addin card according to claim 1, wherein the addin card and the heat dissipation fins receive at least one heat conductive board arranged therebetween.

4. The interlaced heat dissipation structure of the addin card according to claim 1, wherein the cooling pipes, the heat dissipative elements, and the heat dissipation fins are made of metallic materials.

5. The interlaced heat dissipation structure of the addin card according to claim 1, wherein the addin card comprises a graphics card.

* * * * *